United States Patent [19]
Ohmi et al.

[11] Patent Number: 5,360,768
[45] Date of Patent: Nov. 1, 1994

[54] METHOD OF FORMING OXIDE FILM

[75] Inventors: Tadahiro Ohmi, 1-17-301, Komegabukuro 2-chome, Aoba-ku, Sendai-shi, Miyagi-ken 980; Mizuho Morita, Sendai, both of Japan

[73] Assignee: Tadahiro Ohmi, Miyagi, Japan

[21] Appl. No.: 784,434

[22] PCT Filed: May 7, 1990

[86] PCT No.: PCT/JP90/00581

§ 371 Date: Nov. 6, 1991

§ 102(e) Date: Nov. 6, 1991

[87] PCT Pub. No.: WO90/13911

PCT Pub. Date: Nov. 15, 1990

[30] Foreign Application Priority Data

May 7, 1989 [JP] Japan ................................. 1-113958

[51] Int. Cl.$^5$ ............................................. H01G 21/316
[52] U.S. Cl. ...................................... 437/238; 437/247
[58] Field of Search ............................... 437/247, 238

[56] References Cited

U.S. PATENT DOCUMENTS

| | | | |
|---|---|---|---|
| 3,791,862 | 2/1974 | Albano | 437/167 |
| 3,850,687 | 11/1974 | Kern | 437/247 |
| 3,852,120 | 12/1974 | Johnson | 437/247 |
| 3,925,107 | 12/1975 | Gdula | 437/247 |
| 4,176,206 | 11/1979 | Inoue | 437/237 |
| 4,784,975 | 11/1988 | Hofman | 437/247 |

FOREIGN PATENT DOCUMENTS

| | | |
|---|---|---|
| 2143453 | 2/1973 | France . |
| 1189655 | 4/1965 | Germany . |
| 2656396 | 6/1977 | Germany . |
| 51-114875 | 8/1976 | Japan . |
| 54-66075 | 5/1979 | Japan . |
| 55-121653(A) | 9/1980 | Japan . |
| 63-29516(A) | 2/1988 | Japan . |

OTHER PUBLICATIONS

Harada et al., Application of aluminum oxide to integrated circuits fabrication pp. 290-295, IEEE Transaction on Reliability, vol. R-25, No. 5, Dec. 1976.

*Primary Examiner*—Sam Silverberg
*Attorney, Agent, or Firm*—Baker & Daniels

[57] ABSTRACT

The present invention relates to a method of forming an oxide film comprising;
a first step to form an oxide film on the surface of a substrate by bringing a solution containing oxygen and/or oxygen-containing molecule in contact with the surface of said substrate, and a second step to strengthen bond between oxygen and atoms constituting the surface of said substrate in said oxide film by the thermal treatment of said oxide film at a temperature higher than 20° C. in vapor phase of oxygen, oxygen-containing molecule, inert gas alone, or a mixture of two or more of them.

15 Claims, 7 Drawing Sheets

METHOD OF FORMING OXIDE FILM

BACKGROUND OF THE INVENTION

The present invention relates to a method of forming oxide film, and more particularly to a method of forming oxide which makes it possible to form an oxide film at low temperature.

A prior art technology about an oxide film forming method is described by using a silicon substrate.

A thermal oxidation method is well known as a method for forming an oxide film on the surface of a silicon substrate. In this method, an oxide film is formed at a high temperature, e.g. more than 600° C. by bringing a silicon substrate into contact with gas such as dry oxygen, dry oxygen containing a slight amount of hydrogen chloride, or oxygen containing moisture. However, such a method cannot be applied to the low temperature process since the formation of oxide film is carried out at high temperature.

The importance of the low temperature process is described below by reference to the formation of the oxide film of MOS LSI.

A rapid advancement has been made in the LSI technology and DRAM with more than 1 Mbit has already been put into practice. In order to manufacture high efficiency electronic devices, i.e. devices with ultrafine pattern and ultrahigh integration, a high performance process which is highly controlled and not affected by various indeterminate factors is required. The low temperature process is cited as a high performance process.

For example, lowering the formation temperature of an oxide film results in decrease of the impurities released from materials constituting a reaction system. Consequently, the trap density in an oxide film and at the interface between the oxide film and silicon are reduced, and therefore an electrically stable semiconductor device can be realized.

The low temperature process is also effective to decrease the deformation of silicon substrate, and the strain and the defect density in materials constituting a semiconductor device.

Furthermore, if the formation temperature of an oxide film is lower than 600° C., an oxide film can be formed even after the formation of metal or metal alloy with low melting point such as aluminum. Therefore, a semiconductor having various functions can be realized. A temperature of less than 500° C. is particularly desirable since no hillock generates in an aluminum thin film.

As mentioned above, lowering the formation temperature of oxide film is inevitable to realize ultrafine patterned LSI.

The purpose of the present invention is to provide a method of forming oxide film at low temperature.

SUMMARY OF THE INVENTION

The above-mentioned purpose is attained by a method of forming oxide comprising;

a first step to form an oxide film on the surface of a substrate by bringing a solution containing oxygen and/or oxygen-containing molecule in contact with the surface of the substrate, and a second step to strengthen a bond between oxygen and atoms constituting the surface of the substrate in the oxide film by the thermal treatment of the oxide film at a temperature higher than 20° C. in vapor phase of oxygen, oxygen-containing molecule, inert gas alone, or a mixture of two or more of them.

By the present invention, an uniform oxide film of e.g. 0.5 to 10 nm in thickness is reliably reproduced on the surface of a substrate at low temperature. At the same time it is possible to control the bond strength between oxygen and atoms constituting the substrate in the oxide film.

11 Electrode formed on the back of a substrate
12 p+ substrate
13 n+ buried region
14 High resistance p− region
15 High resistance n− region
16 isolation region
17,18 n+ region
19,20 p+ region
21,22,23,24 Metal silicide
25,26 Silicon oxide film (gate insulating film)
27,28 Gate electrode
29,30,31 Metal electrode
32,33,34 Metal fluoride (AlF$_3$)
b 35 PSG film, nitride film

DESCRIPTION OF PREFERRED EMBODIMENT

The embodiments of the present invention are described by referring to the figures.

Figure 1:
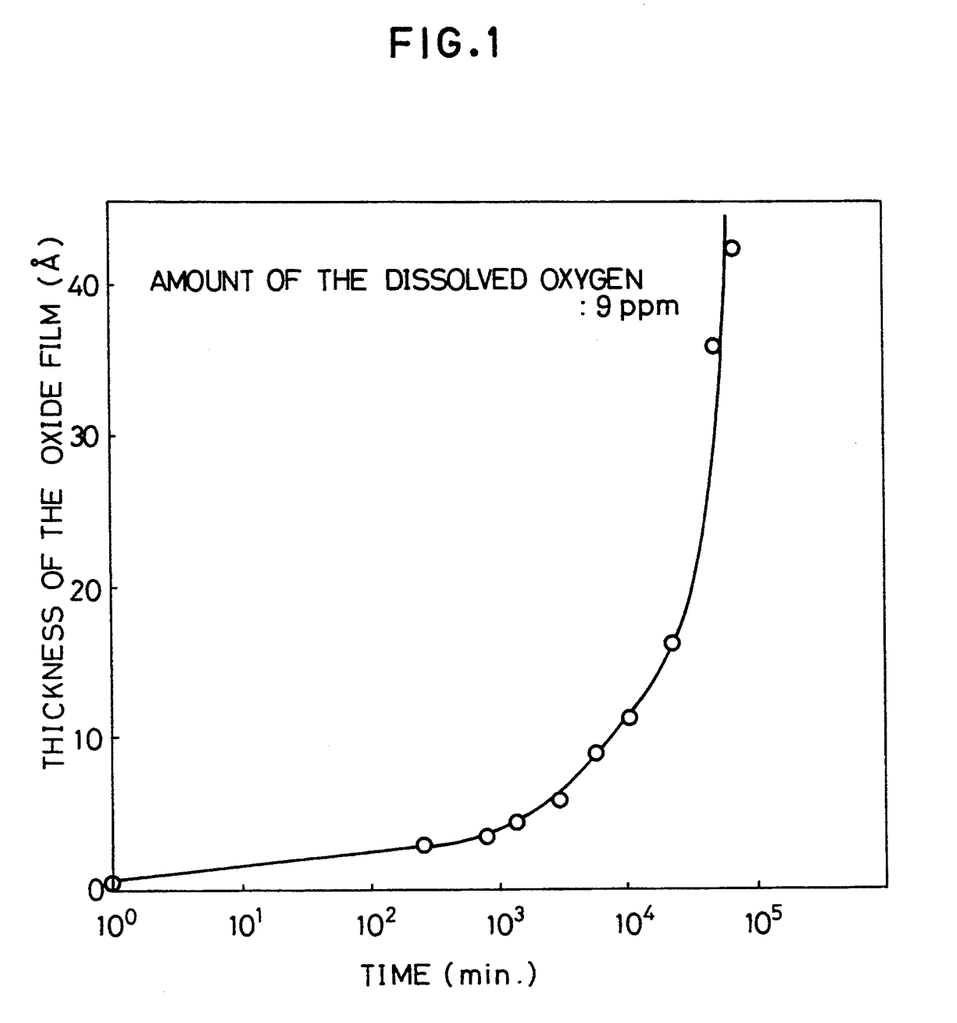
FIG. 1 is a diagram showing the thickness of oxide film to be formed on a silicon surface in ultrapure water as a function of elapsed time.

FIG. 1 is a diagram showing the change of the thickness of oxide film formed on a silicon surface with time when a silicon substrate is immersed in ultrapure water containing 9 ppm oxygen by volume. The thickness of the oxide film was measured with an ESCA and an elipsometer. In FIG. 1, the thickness of the oxide film formed on the silicon substrate is plotted on the ordinate, and the elapsed time after the substrate being immersed in ultrapure water at 23° C. is plotted on the abscissa.

As is shown in FIG. 1, the oxide film of 4.2 nm in thickness was formed after a silicon wafer had been placed in the pure water containing dissolved oxygen of 9 ppm for 46 days.

Table 1 shows the thickness of the oxide film and bond energy between silicon and oxygen atoms in the oxide film after the oxide film of 4.2 nm in thickness which had been formed in the pure water was heated at 500° C. in oxygen gas or nitrogen gas atmosphere for 1 hour.

TABLE 1

|  | oxide film, nm | bond energy, eV |
|---|---|---|
| after 46 days in pure water | 4.20 | 4.49 |
| after O$_2$ anneal at 500° C. for 1 hour | 4.96 | 4.87 |
| after N$_2$ anneal at 500° C. for 1 hour | 3.98 | 4.72 |

The values of bond energy shown in Table 1 are the difference of bond energy between an $Si_{2p}$ peak of a silicon-oxygen bond and an $Si_{2p3/2}$ of a silicon-silicon bond in X-ray photoelectron spectrum.

The thickness of the oxide film increased to 4.9 nm after the thermal treatment (annealing) in oxygen gas, and decreased slightly to 3.98 nm after the thermal treatment in nitrogen gas. The bond energy increased after the thermal treatment in both oxygen and nitrogen gas. The bond energy of the oxide film thus prepared is greater than that of the oxide film which is formed on the silicon surface in dry oxygen at 800° C.

It has been found that an oxide film of more than 3 nm in thickness and large bond energy between silicon and oxygen atoms can be formed by the method; for example, by heating a silicon substrate in oxygen gas or nitrogen gas atmosphere after the substrate has been immersed in pure water containing 9 vol. ppm oxygen.

It is Impossible by a prior art thermal oxidation method to form an oxide film with a thickness of more than 3 nm at a temperature of less than 600° C. The present inventors have also found out that an oxide film with a thickness of 4.81 nm and a bond energy of 4.64 eV is formed by the thermal treatment at 800° C. for 20 minutes in ultrapure atmosphere in which impurities such as moisture and carbon dioxide are reduced to less than tens of ppb, or preferably to several ppb. However, such an oxide film cannot be applied to a semiconductor device shown in FIG. 2 in which electrodes 29, 30, 31 are made of Al. This oxide film can be used only in the case that electrode regions 29, 30, 31 are made of materials having a high melting point such as Mo, W, Ta, TI, Pd, or silicides of these metals. On the other hand, the present method can be applied to not only the case in which the regions 29, 30, 31 are made of high melting point materials, but also to the case which the regions are made of Al. Furthermore, it is also possible to increase the bond energy to more than 4.64 eV by the present method.

The aqueous solution in which oxygen and/or oxygen-containing molecules are dissolved, used in the first step of the present invention, is an aqueous solution containing oxygen, an aqueous solution containing ozone, hydrogen peroxide, a sulfuric acid and hydrogen peroxide solution, a hydrogen chloride and hydrogen peroxide solution, or an ammonia and hydrogen peroxide solution, for example. Here, it is also possible to use a solution in which oxygen is dissolved in hydrogen peroxide.

In the first step of the present invention, an oxide film is formed on a substrate by bringing a substrate surface in contact with a solution in which an oxygen and/or oxygen-containing molecule is dissolved. Here, it is preferable because the formation rate of an oxide film is increased that the solution is brought into contact with a catalyst to accelerate the decomposition of the molecule contained in the solution. Therefore, when the substrate is brought in contact with the solution with dissolved oxygen of, e.g. 0.1 vol ppm, the adoption of the catalyst makes it possible to use the solution with dissolved oxygen less than 0.1 vol. ppm at the beginning.

As an example of a solid catalyst, platinum is used. The contact of hydrogen peroxide with a platinum catalyst causes an oxygen radical to generate from hydrogen peroxide, and as a result, the effect on the formation rate of an oxide film becomes remarkable. For example, 1 nm thick oxide film is formed at room temperature in 30 minutes, and 2 to 5 nm thick film is formed at 70° to 85 ° C. in 24 hours. Namely, the oxide film used, e.g. a gate oxide film of MOS LSI, can be obtained in a short time to be put into practical application. It is desirable to use hydrogen peroxide which contains no stabilizer. The content of TOC in hydrogen peroxide is required to be less than 1 ppm and is preferable to be less than 0.1 ppm. Also in other solutions, an impurities content of less than 1 ppm is desirable and less than 0.1 ppm is preferable.

In the first step of the present invention, when the content of dissolved oxygen or oxygen-containing molecule in the solution is more than 0.1 vol ppm, the oxidation film is formed on the silicon substrate surface in relatively short time, and the formation rate of the oxide film increases as the content of dissolved oxygen or oxygen-containing molecule increases.

Though the solubility limit of oxygen is 14 ppm in aqueous solution at 0° C. and at atmospheric pressure, it is possible to increase the content of dissolved oxygen in the following manner. Namely, the content of dissolved oxygen or oxygen-containing molecule can be increased by, e.g., immersing a silicon substrate into ultrapure water in a closed vessel, by introducing oxygen gas into the vessel, and then by increasing the pressure of oxygen.

The upper limit value of 10000 vol. ppm is desirable as the content of oxygen and/or oxygen-containing molecule.

in the second step of the present invention, the same oxygen-containing molecule as used in the first step can also be used in vapor phase. The inert gas is nitrogen gas, argon gas or helium gas, for example. Oxygen, oxygen-containing molecule, inert gas or a mixture of them are also used. In order to increase the bond energy, it is desirable to reduce the Impurities in the vapor phase, such as moisture or hydrocarbons to less than tens of ppb, and preferable to less than 0.1 ppb.

In the case in which an oxygen or oxygen-containing molecule is contained in the atmosphere of the second step, the formation rate of the oxide film increases remarkably. A temperature range of 20° to 600° C. is desirable, and a range of 100° to 500° C. is preferable. Furthermore, a temperature close to 500° C. is better from the practical use point of view because the film can be formed in shorter time.

The temperature of thermal treatment in the second step is set to be as high as possible only if the wafer condition is allowed. The pressure of the atmosphere is not restricted; therefore any condition such as reduced pressure, atmospheric pressure or high pressure condition is available.

Next, a semiconductor device constructed by the method of the present invention is described by reference the figures.

Figure 2:
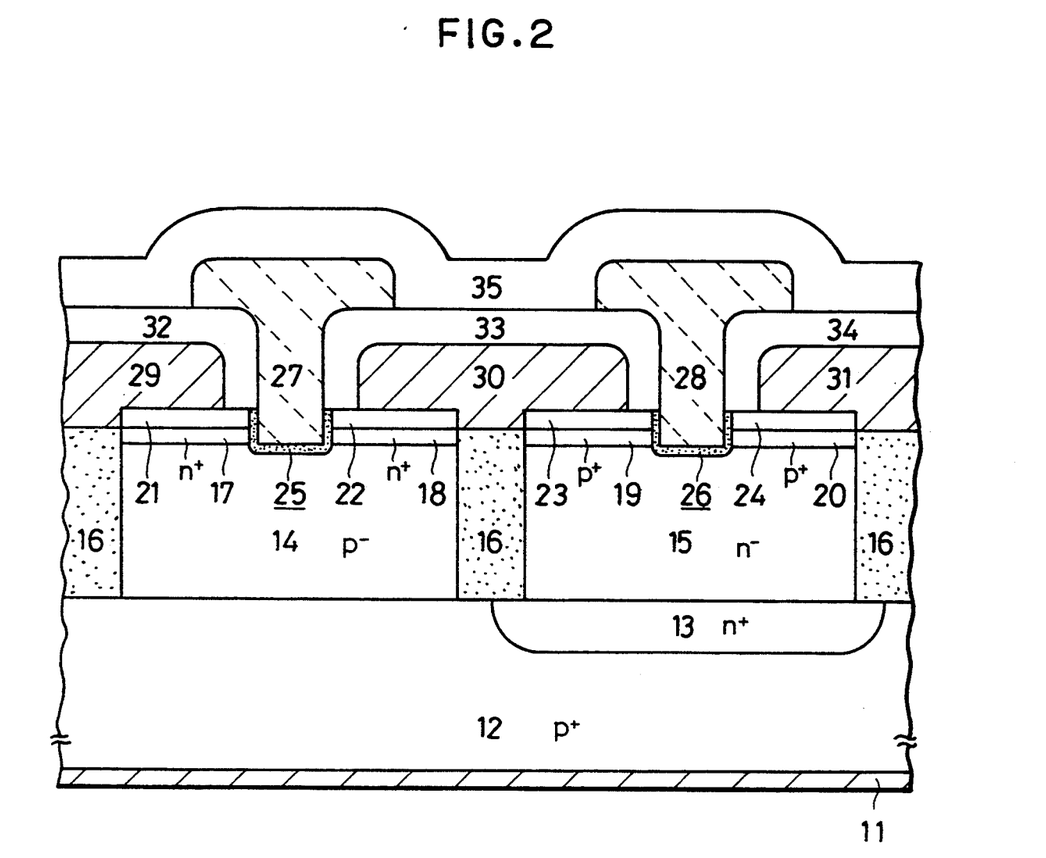
FIG. 2 is a cross-sectional view of a semiconductor device constructed by the embodiment of the present invention.

FIG. 2 is a cross-sectional view of the semiconductor device according to the embodiment. Only one CMOS element of the semiconductor device is drawn in the figure. Here, 11 is an electrode on back of a substrate, 12 is a p+ substrate, 13 is an n+ buried layer, 14 is a p− high resistance region, 15 is an n− high resistant region, 16 is an isolation region, 17 and 18 are n+ regions, 19 and 20 are p+ regions, 21, 22, 23, and 24 are metal silicide such as $MOSi_2$, $WSi_2$, $TaSi_2$ or $Pd_2Si$, 25 and 26 are silicon oxide films (gate insulating film) formed in the same manner as mentioned previously, 27 and 28 are gate electrodes, 29, 30 and 31 are metal electrode such as Al, AlSi or AlCu, 32, 33 and 34 are metal fluoride films for electrically separating electrodes 27, 28, 29 and 30; for example, AlF₃ when Al is used as an electrode, and 35 is a PSG film or a nitride film for passivation.

in FIG. 2, the interface between gate insulating film 25 and region 14 is formed deeper in the region 14 than those between regions 17, 18 and region 14. The interface between gate insulating film 26 and region 15 is also formed deeper in the region 15 than those between regions 19, 20 and region 15. The short-channel effect does not easily occur in this structure because the electric field between a source and a drain is weakened in the channel.

in FIG. 2, gate electrodes 27, 28 are preferably made of materials such as Al, AlSi or AlCu which have a large diffusion potential or built-in potential to both n+ region 17, 18 and p+ region 19, 20. For example, Al has a diffusion potential or a built-in potential of about 0.7 V to n+ region and of about 0.4 V to p+ region. The selected material of electrode is a matter of design choice provided that the work function of the electrode has a large barrier to both n+ region and p+ region. Thus, high melting point metals or metal silicides are also available. Therefore, the resistance of the gate electrode is small. In this structure, the diffusion potentials or built-in potentials of p+ substrate 12 and gate electrode 27 to n+ source region and those of n+ buried region 13 and gate electrode 28 to p+ source region produce potential barrier in the channel, and therefore the normally-off characteristic of MOS transistor is attained at a low impurity concentration of $10^{14}$ to $10^{16}$ cm$^{-3}$ in channel regions 14, 15. Namely, the regions 14, 15 are of high resistance, and the concentration of impurities is maintained low. The channels which electrons or holes pass through are maintained wide and therefore a short channel is realized without causing a decrease in the mobility of the carrier. Consequently, MOS transistor with large conversion conductance $g_m$ can be obtained.

In FIG. 2, a junction plane between n+ region 17 and region 14, that between n+ region 18 and region 14, that between p+ region 19 and region 15, and that between p+ region 20 and region 15 are flat and of small area, resulting in the small fringe effect and small capacitance between a source region and a substrate, between a drain and a substrate and between a source region and a drain region.

In FIG.2, electrodes 29, 30, 31 are made of, e.g. Al, AlSi, AlCu and AlCuSi and therefore, the resistance of the source and drain electrodes is small. Because of the small resistance of source, drain and gate, of small capacitance of a source and drain capacitor, and of large conversion conductance $g_m$, the transistor has high speed performance characteristics. Metals such as Mo, W, Ta and Ti can also be used as a source and a drain electrode.

By using a semiconductor device having the oxide film formed by the process mentioned previously, a semiconductor integrated circuit composed of a high speed insulated gate transistor can be realized.

A p+ substrate 12 with a burled region 13 is used in FIG. 2. As a substrate of the semiconductor device, insulator substrates such as sapphire, spinel, quartz, AlN or SiC are also available.

In FIGS. 3(a)-3(e), there is shown an example of a manufacturing process of the semiconductor device shown in FIG. 2. Here, explanation is made for the case that a p+ substrate is used as a substrate.

Figure 3A:
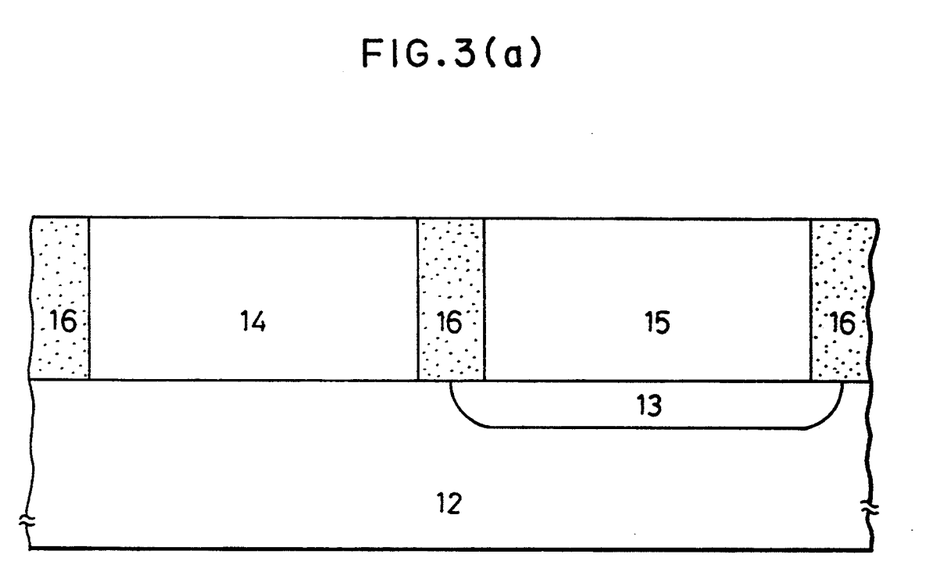
FIG. 3(a)–3(e) are cross-sectional views of a semiconductor device showing manufacturing process thereof according to the embodiment of the present invention.

First, n+ buried region is formed by diffusing P from a PSG film deposited on the region 13 of p+ substrate 12 by, e.g., a CVD method. The region 13 can also be formed by ion implantation of P or As and following annealing for activation. Isolation region 16, p− region 14 and n− region 15 are formed in the following manner. For example, after the thermal oxidation film of tens of nm thickness is formed on the surface of the substrate 12 having buried region 13, a PSG film or BPSG film of prescribed thickness is deposited. The portion corresponding to the region 14, 15 in the thermal oxidation film and PSG film or BPSG film is removed by reactive ion etching. Then, selective epitaxial film is formed on regions 14, 15 by the use of, e.g. CVD method using SiH₄, Si₂H₆ or SiH₂Cl₂.

in this manner, the structure shown in FIG. 3(a) is constructed. The manufacturing method is not restricted by that mentioned above, and the selected thickness of regions 14, 15 is a matter of design choice. Thicknesses of 0.03-0.5 μm are typically selected.

Figure 3B:
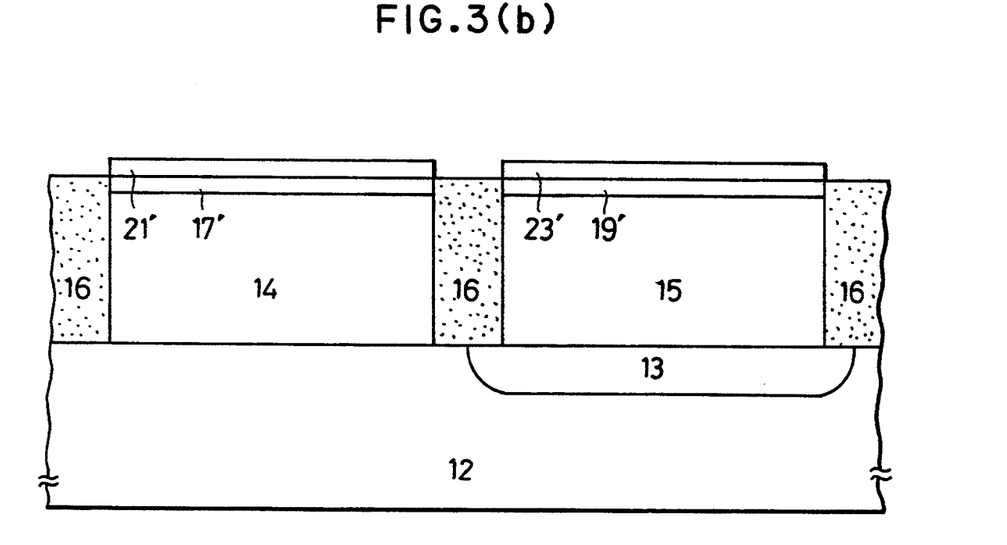
Figure 3C:
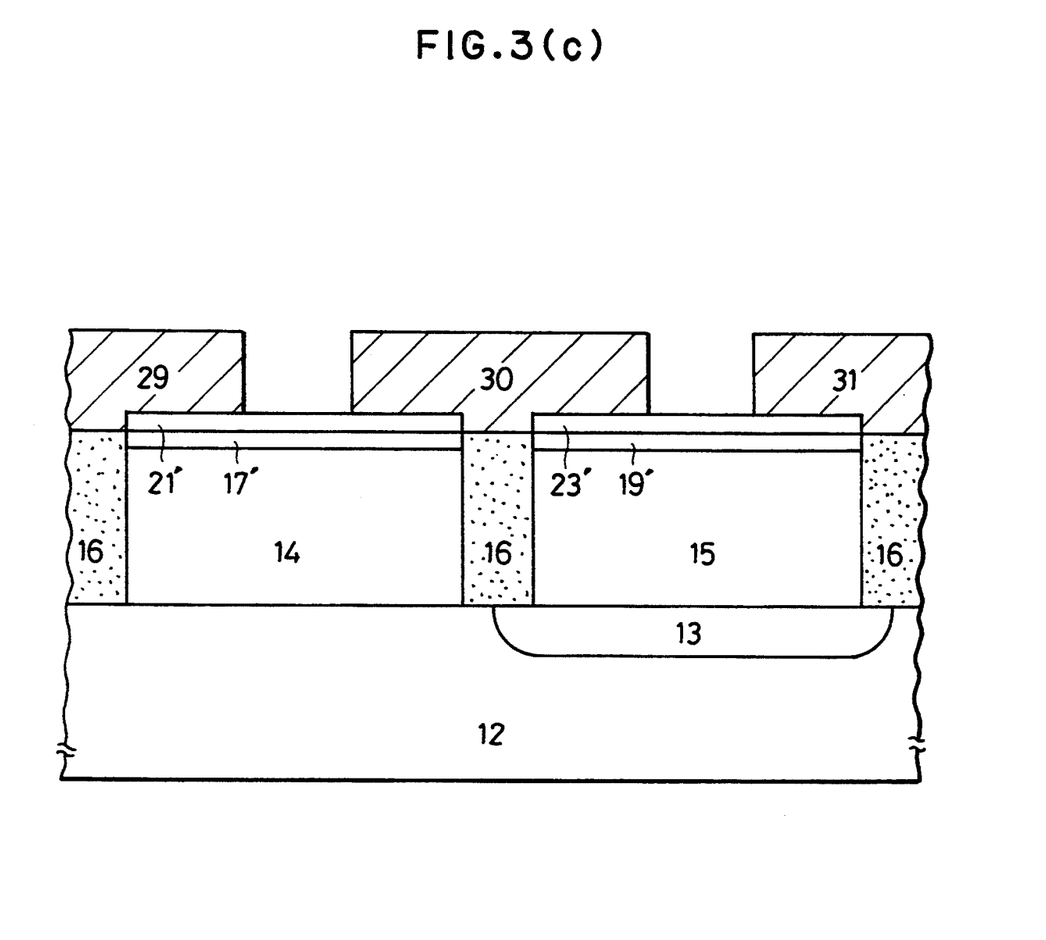

Next, only on the surface of the regions 14, 15 is selectively deposited a metal layer of 10 to 20 μm thickness, such as W, Ta, Ti and Mo. Then, for example, As is implanted into region 14, and B and Si are implanted into region 15 through the metal layer by ion implantation. Thereafter annealing is carried out for activation. Thus, regions 21', 23', of metal silicide layer, n+ region 17', and p+ region 19', are formed as shown in FIG. 3(b). Then, an Al film of 0.2 to 1.0 μm thickness is deposited by sputtering or CVD, and then prescribed portions are removed by reactive ion etching as shown in FIG. 3(c). The surface of regions 29, 30, 31 is fluorinated at, e.g. 100° C. for 4 hours by using ultrapure F₂ gas and then is annealed at 150° C. in inert gas such as nitrogen gas for 5 hours to form an insulating layer of AlFl₃ which is shown as regions 32, 33, 34 on the Al surface in FIG. 3(d).

Figure 3D:
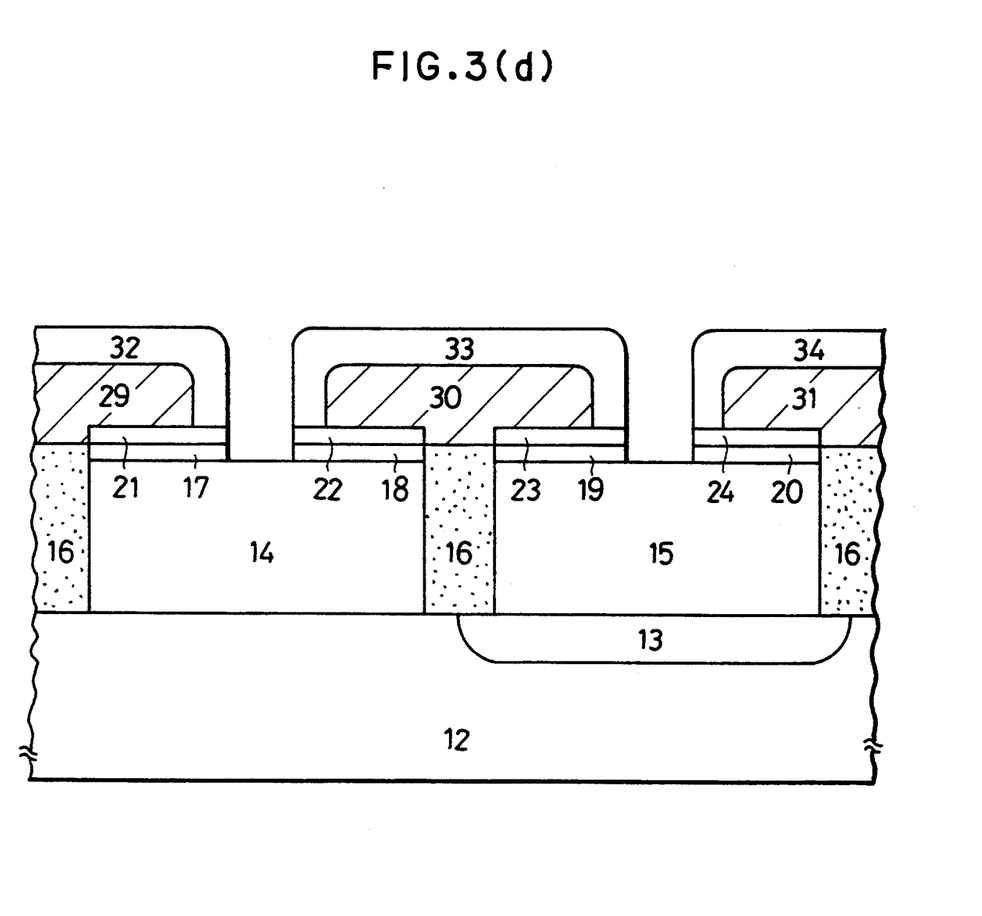
Figure 3E:
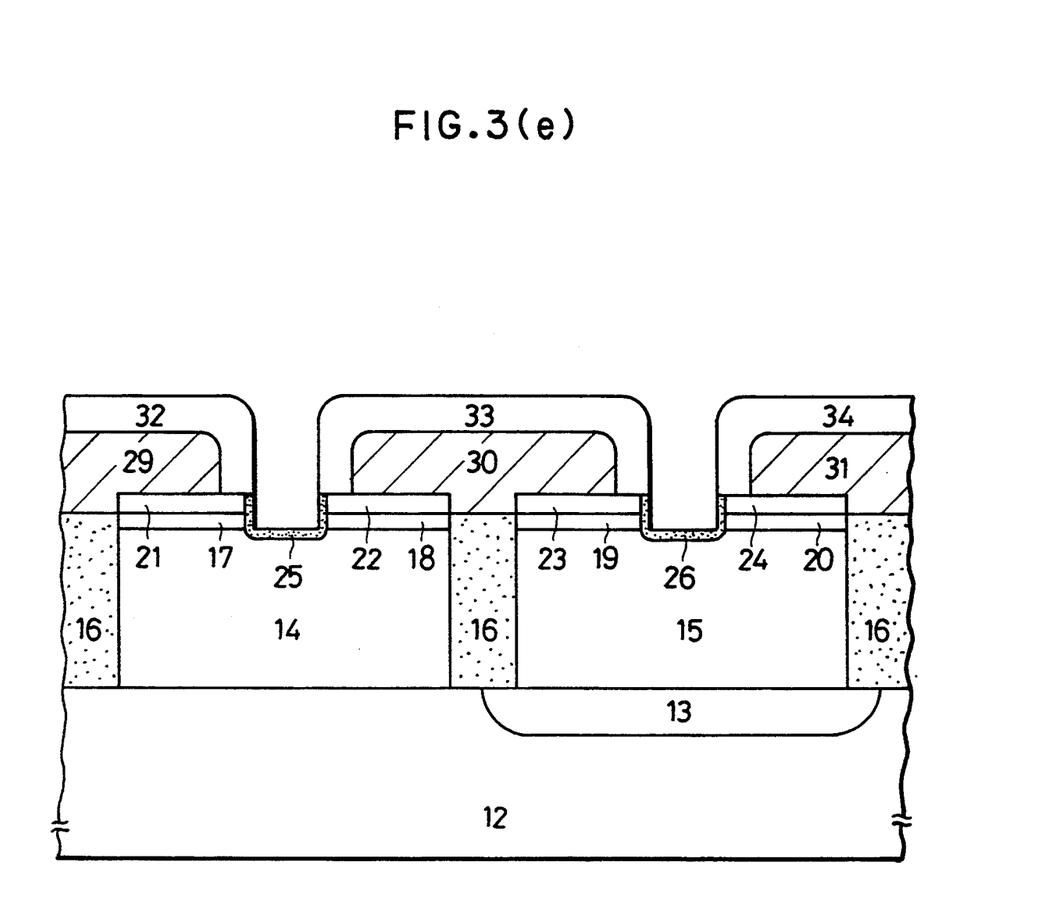

As shown in FIG. 3(d), contact holes are formed by etching a prescribed portion of metal silicide, n+ region and p+ region. In this etching process, the regions 32, 33, 34 act as a mask.

By the oxidation treatment mentioned previously, the oxide films are formed on the exposed surface inside the contact holes. Namely, the oxide films are formed at a temperature less than 500° C. on silicide layer, n+ region and p+ region, as shown in FIG. 3(d).

Furthermore, after the formation of gate electrodes 27, 28, the etching of prescribed portions thereof and the formation of passivation layer 35 and electrode 11, the semiconductor device shown in FIG. 2 is constructed.

Although the description has been made mainly on the silicon surface so far, the present invention is also applicable to the surface of any materials such as other semiconductors and metals as well as the surface of silicon.

As an experiment, two pieces of silicon wafer were immersed in 30% hydrogen peroxide solution which was in contact with a platinum catalyst. After 1 hour, an oxide film of 7 Å in thickness was formed on the silicon wafer. The oxide film thus formed was such that the difference of bonding energy between the $Si_{2p}$ peak due to a silicon-oxygen bond and the $Si_{2p3/2}$ peak due to a silicon-silicon bond was 3.99 eV in the X-ray photoelectron spectrum. This oxide film is described as the oxide film 1 hereinafter.

One of two wafers on which the oxide film 1 had been formed was thermally treated at 800° C. for 1 hour in nitrogen gas containing impurities of less than several ppb. After this treatment, the thickness or the oxide film became 9 A and the difference of the bonding energy became 4.22 eV between the $Si_{2p}$ peak due to a silicon-oxygen bond and the $Si_{2p3/2}$ peak due to silicon-silicon bond in the X-ray photoelectron spectrum. The oxide film after the thermal treatment is described as the oxide film 2.

Both the wafer with the oxide film 1 and that with the oxide film 2 were placed in an atmosphere containing hydrogen fluoride of 0.6 to 1.3 vol. % and moisture of $10^{-2}$ to 5 ppm. The oxide film 1 was easily removed but the oxide film 2 was not removed, indicating that the oxide film 2 can be used as a mask in the etching process.

An electric voltage of 1 V was applied to the oxide films 1 and 2. An electric current passing through the oxide film 1 was more than 1 A/cm$^2$; on the other hand, a current passing through the oxide film 2 was less than $1 \times 10^{-4}$ A/cm$^2$. Thus, the film with the bonding energy difference between the $Si_{2p}$ peak and the $Si_{2p3/2}$ peak of more than 4.1 eV has excellent dielectric strength.

Therefore, by applying the oxide film 2 to various insulators, e.g. a gate insulating film, a semiconductor device with excellent performance can be obtained. Furthermore, it is possible to decrease the thickness of the insulator in various devices and use such film as, e.g. tunnel insulating films.

Application To industries

According to the present invention. It is possible to form an oxide film on a substrate surface at low temperature and at the same time to control the bond strength between oxygen and atoms constituting the substrate surface in the oxide film. The present invention having such a feature makes it possible to form an oxide film with a prescribed thickness of e.g. 0.5 to 10 nm at a low temperature or e.g. less than 600° C. and to increase the bond strength of oxygen and atoms constituting the surface of the substrate in the oxide film to the value larger than that in the oxide film formed by the thermal oxidation at high temperature.

Though the high temperature treatment has brought about various problems in manufacturing high efficiency semiconductor devices, these problems are solved by the present invention and even ultrafine patterned element and a process for large size wafer which are strongly required nowadays can be realized.

Since the method of the present invention can be carried out at a temperature close to room temperature, an oxide film is formed by using a reaction apparatus with simple structure. Thus, a high efficiency semiconductor device is manufactured at low cost as compared with the method where oxide film is formed at high temperature.

Furthermore, when ion implantation process is involved in the manufacturing process, undesirable diffusion of implanted ions can be prevented because of low temperature treatment.

What is claimed is:

1. A method of forming a silicon oxide film comprising:
  a first step of forming an oxide film on the surface of a silicon substrate by bringing a solution containing oxygen and/or oxygen-containing molecules, the impurities of which are less than 1 ppm, into contact with the surface of said substrate; and
  a second step of strengthening the bond between oxygen and silicon atoms constituting the surface of said substrate in said oxide film by the thermal treatment of said oxide film at a temperature between 20° C. and 600° C. in the atmosphere of one of oxygen, oxygen-containing molecule, inert gas alone, and a mixture of two or more of them, which contains impurities of not more than 100 ppb.

2. The method according to claim 1, wherein the content of oxygen and/or oxygen-containing molecule dissolved in said solution is more than 0.1 ppm.

3. The method according to claim 1, wherein said first step is carried out by bringing said solution in contact with a catalyst to accelerate the decomposition of oxygen and/or oxygen-containing molecule contained in said solution.

4. The method according to claim 2, wherein said first step is carried out after the dissolved content of oxygen and/or oxygen-containing molecule is increased to more than 0.1 ppm by bringing a solution in which the initial content of oxygen and/or oxygen-containing molecule is less than 0.1 ppm with a catalyst to accelerate the decomposition of oxygen and/or oxygen-containing molecule.

5. The method according to one of claim 1 wherein said oxygen-containing molecule is hydrogen peroxide.

6. The method according to claim 1 wherein said inert gas is nitrogen, argon or a mixture thereof.

7. The method according to claim 1, wherein the temperature of the thermal treatment in said second step is a range of 100° through 500° C.

8. The method according to claim 2, wherein said first step is carried out by bringing said solution in contact with a catalyst to accelerate the decomposition of oxygen and/or oxygen-containing molecule contained in said solution.

9. The method according to claim 2, wherein said oxygen-containing molecule is hydrogen peroxide.

10. The method according to claim 2, wherein said inert gas is nitrogen, argon or a mixture thereof.

11. The method according to claim 2, wherein the temperature of the thermal treatment in said second step is lower than 600° C.

12. The method according to claim 3, wherein said oxygen-containing molecule is hydrogen peroxide.

13. The method according to claim 3 wherein said inert gas is nitrogen, argon or a mixture thereof.

14. The method according to claim 3, wherein the temperature of the thermal treatment in said second step is lower than 600° C.

15. The method according to claim 1, wherein the thickness of the oxide film ranges from 0.5 nm to 10 nm.

* * * * *